United States Patent
Kamiya et al.

(10) Patent No.: US 8,197,713 B2
(45) Date of Patent: Jun. 12, 2012

(54) FLUORESCENT POWDER, PROCESS FOR PRODUCING THE SAME, AND LIGHT EMITTING DEVICE, DISPLAY DEVICE, AND FLUORESCENT LAMP CONTAINING FLUORESCENT POWDER

(75) Inventors: Sumio Kamiya, Toyota (JP); Masaru Ishii, Aichi (JP); Satoko Inuzuka, Toyota (JP); Kazumichi Yanagisawa, Kochi (JP); Wuxing Zhang, Kochi (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 204 days.

(21) Appl. No.: 12/523,350

(22) PCT Filed: Jan. 18, 2008

(86) PCT No.: PCT/JP2008/051019
§ 371 (c)(1),
(2), (4) Date: Jul. 16, 2009

(87) PCT Pub. No.: WO2008/088085
PCT Pub. Date: Jul. 24, 2008

(65) Prior Publication Data
US 2010/0079057 A1    Apr. 1, 2010

(30) Foreign Application Priority Data
Jan. 19, 2007    (JP) .................................. 2007-010649

(51) Int. Cl.
*C09K 11/54*    (2006.01)
*H01J 1/62*    (2006.01)
(52) U.S. Cl. .................................. 252/301.6 R; 313/486
(58) Field of Classification Search .................. None
See application file for complete search history.

(56) References Cited

U.S. PATENT DOCUMENTS
2002/0185055 A1    12/2002    Oka
(Continued)

FOREIGN PATENT DOCUMENTS
EP    358 078    3/1990
(Continued)

OTHER PUBLICATIONS
W. Zhang et al., "Stable Yellow Photoluminescence of Hydrothermally Synthesized ZnO" (2008).
(Continued)

*Primary Examiner* — Emily Le
*Assistant Examiner* — Sarah A Slifka
(74) *Attorney, Agent, or Firm* — Finnegan, Henderson, Farabow, Garrett & Dunner, LLP

(57) ABSTRACT

According to the present invention, a fluorescent powder composed mainly of an acicular or fibrous zinc oxide single crystal with an aspect ratio of 5 or higher is produced by the following steps:
a step of producing a raw material solution selected from the group consisting of a raw material solution (A) that is an alkali solution containing zing ions, a raw material solution (B) that is a solution containing zinc ions and ions of dopant element, and a mixed solution of the raw material solution (A) and the raw material solution (B); and
a hydrothermal reaction step wherein a hydrothermal reaction of the mixed solution is carried out in a hermetically sealed vessel at a subcritical or supercritical temperature and at a subcritical or supercritical pressure.
A zinc oxide single crystal powder can be produced at low cost without the need for a pulverization step or a similar step and high-density orientation can be realized by such crystal powder. Such crystal powder is most suitable for light emitting devices, display devices, fluorescent lamps, and the like.

3 Claims, 2 Drawing Sheets

U.S. PATENT DOCUMENTS

| | | |
|---|---|---|
| 2003/0084838 A1 | 5/2003 | McCandlish et al. |
| 2007/0193499 A1 | 8/2007 | Fukuda et al. |

FOREIGN PATENT DOCUMENTS

| | | |
|---|---|---|
| JP | 50-14587 | 2/1975 |
| JP | 02-060988 | 3/1990 |
| JP | 9-291279 | 11/1997 |
| JP | 11-26165 | 1/1999 |
| JP | 2003-002790 | 1/2003 |
| JP | 2003-335518 | 11/2003 |
| JP | 2004-99692 | 4/2004 |
| JP | 2004-520260 | 7/2004 |
| JP | 2005-39131 | 2/2005 |
| WO | WO 2005/114256 | 12/2005 |

OTHER PUBLICATIONS

L. Fan et al., "Hydrothermal Synthesis and Photoluminescent Properties of ZnO Sub-micrometer and Micrometer Rods," Optical Materials, vol. 29, No. 5, pp. 532-538 (2007).

C. Lu et al., "Microwave-Hydrothermal Synthesis and Photoluminescence Characteristics of Zinc Oxide Powders," J. Mater. Res., vol. 20, No. 2, pp. 464-471 (2005).

L. Dem'Yanets et al., "Zinc Oxide: Hydrothermal Growth of Nano- and Bulk Crystals and Their Luminescent Properties," J. Mater. Sci., vol. 41, pp. 1439-1444 (2006).

K. Lee et al., "The Study on the Preparation of Fluorescence Willemite Powders by Hydrothermal, Wet and Solid State Reaction," J. Korean Ceram. Soc., 1991, vol. 28, No. 1, pp. 74-78 (1991).

Sun, G. et al., "Anionic surfactant-assisted hydrothermal synthesis of high-aspect-ratio ZnO nanowires and their photoluminescence property," Materials Letters 60 (2006), pp. 2777-2782.

Liu, C. et al., "Preparation of ZnO cluster and rod-like whiskers through hydrothermal methods," Materials Letters 60 (2006), pp. 1394-1398.

Extended European Search Report for EP Appl. No. 08703846.9 dated Feb. 8, 2011.

Piticescu, R.R. et al., "Synthesis of Al-doped ZnO nanomaterials with controlled luminescence," Journal of the European Ceramic Society, vol. 26, (2006), pp. 2979-2983.

A  1000-fold magnification

B  2000-fold magnification

C  4000-fold magnification

US 8,197,713 B2

FLUORESCENT POWDER, PROCESS FOR PRODUCING THE SAME, AND LIGHT EMITTING DEVICE, DISPLAY DEVICE, AND FLUORESCENT LAMP CONTAINING FLUORESCENT POWDER

CROSS-REFERENCE TO RELATED APPLICATIONS

This application is a national phase application of International Application No. PCT/JP2008/051019, filed Jan. 18, 2008, and claims the priority of Japanese Application No. 2007-010649, filed Jan. 19, 2007, the contents of both of which are incorporated herein by reference.

TECHNICAL FIELD

The present invention relates to an acicular zinc oxide fluorescent powder and a process for producing the same. Such fluorescent powder is used for display devices such as displays for televisions and personal computers, displays for device control panels, and displays used for displaying public announcements and advertisements, as well as for a variety of lighting devices. In addition, the present invention relates to a light emitting device, a display device, and a fluorescent lamp, each of which contains the fluorescent powder.

BACKGROUND ART

Display devices such as cathode ray tubes (CRTs), liquid crystal display devices, vacuum fluorescent displays (VFDs), light emitting diodes (LEDs), and electroluminescence (EL) display devices have been widely used. In recent years, along with significant progress in information technologies, etc., there are rapidly increasing demands in terms of high performance and high functions of display devices; for example, high levels of display quality (high intensity, high definition, large area, wide viewing angle, etc.), low power consumption, space saving, and weight reduction. In response to such demands in terms of performance, sophistication of widely available display devices is actively being made. In addition, plasma display panels (PDPs) have become commercially available in recent years. Further, the research and development of future promising display devices such as field emission displays (FEDs) and flat-panel type vacuum fluorescent displays (fluorescent display tubes) have been actively conducted.

Meanwhile, electron beam or ultraviolet irradiation can cause some zinc oxides (ZnO) to emit blue-green light (i.e. green light containing a blue element). Fluorescent powders of such zinc oxides are characterized by exhibiting high light emission efficiencies upon low-speed electron beam irradiation at an accelerating voltage of 1 kV or less. Therefore, they have been used in practice for vacuum fluorescent displays. However, fluorescent powders have some drawbacks when applied to novel display devices such as field emission displays and flat-panel type vacuum fluorescent displays.

Zinc oxides (ZnO) have been gaining attention in terms of fluorescence compared with other sulfide-based phosphorus materials. Zinc oxides (ZnO) have fluorescence properties that are influenced by structural formations thereof. This is because surface defects of zinc oxides (ZnO) significantly influence the fluorescence excitation bands and intensities.

It has been attempted to form thin-film zinc oxide fluorescent substances by use of electron beam deposition methods, sputtering methods, pulse laser deposition methods, spray pyrolysis methods, and other methods. However, it is still impossible to obtain a practically available thin-film fluorescent substance that exhibits high intensity and high light emission efficiency. In addition, when using the above conventional methods, it is necessary to heat a substrate at a high temperature or carry out heat treatment at a high temperature. Therefore, it is difficult to cause formation of a zinc oxide fluorescent substance thin film on a transparent conductive layer or a color filter without inducing deterioration of such layer or filter. As a result, light emission intensity and color purity deteriorate, which is problematic.

As an aside, JP Patent Publication (Kokai) No. 2005-039131 A discloses a process for producing a zinc oxide single crystal with the use of a hydrothermal synthesis method. Specifically, the document discloses a process for producing a zinc oxide single crystal wafer, which comprises a two-stage heat treatment step involving a pre-heat treatment for realization of low resistance and a subsequent heat treatment for planarization.

DISCLOSURE OF THE INVENTION

The invention disclosed in JP Patent Publication (Kokai) No. 2005-039131 A concerns a process for producing a zinc oxide single crystal with the use of a hydrothermal synthesis method. In this case, however, a product of interest is a zinc oxide single crystal wafer. For the purpose of using a zinc oxide (ZnO) single crystal for light emitting devices, display devices, fluorescent lamps, and the like, a fluorescent powder that can result in high density orientation has been awaited. In order to obtain a fluorescent powder from a block product such as a zinc oxide single crystal wafer, it is necessary to carry out a pulverization step. However, pulverization is likely to cause generation of crystal surface defects or incorporation of impurities, which is seriously problematic.

Therefore, it is an object of the present invention to produce a zinc oxide single crystal powder at low cost without the need for a pulverization step or a similar step. Such crystal powder can be oriented in high density and is most suitable for light emitting devices, display devices, fluorescent lamps, and the like.

The present inventors have found that a zinc oxide single crystal powder with a specific structure that is obtained by a specific production process has excellent properties as a fluorescent powder. This has led to the completion of the present invention.

Specifically, in a first aspect, the present invention relates to a fluorescent powder composed mainly of an acicular or fibrous zinc oxide single crystal having an aspect ratio of 5 or higher. Since the fluorescent powder of the present invention is an acicular or fibrous fluorescent powder having an aspect ratio of 5 or higher, high density orientation can be achieved and thus the fluorescent powder is most suitable for light emitting devices, display devices, fluorescent lamps, and the like.

The fluorescent powder of the present invention may contain, as a dopant, one or more selected from the group consisting of Co, Mn, Cd, Fe, Ni, Al, and Sn. When the fluorescent powder is doped with Co or the like, a variety of peak wavelengths (fluorescence colors) can be obtained. In addition, it is possible to allow the single crystal to have different formations.

According to the present invention, fluorescent powders having several wavelengths can be obtained. However, a typical example thereof is a fluorescent powder having a luminescence peak observed by photoluminescence (PL) evaluation in the neighborhood of 600 nm. Also, a fluorescent powder having two luminescence peaks observed by photoluminescence (PL) evaluation in the neighborhoods of 500 nm and 600 nm can be obtained.

In a second aspect, the present invention relates to a process for producing the above fluorescent powder composed mainly of an acicular or fibrous zinc oxide (ZnO) single crystal having an aspect ratio of 5 or higher, which comprises the following steps: a step of producing a raw material solution selected from the group consisting of a raw material solution (A) that is an alkali solution containing zinc ions, a raw material solution (B) that is a solution containing zinc ions and ions of dopant element, and a mixed solution of the raw material solution (A) and the raw material solution (B); and a hydrothermal reaction step wherein a hydrothermal reaction of the mixed solution is carried out in a hermetically sealed vessel at a subcritical or supercritical temperature and at a subcritical or supercritical pressure. According to the present invention, a fluorescent powder of an acicular or fibrous zinc oxide (ZnO) single crystal having an aspect ratio of 5 or higher can be directly produced without a pulverization step or a similar step.

In the process for producing a fluorescent powder of the present invention, the zinc ions may be unsaturated, semi-saturated, or saturated in the raw material solution (A), the raw material solution (B), and the mixed solution of the raw material solution (A) and the raw material solution (B).

As described above, in the process for producing a fluorescent powder of the present invention, the ions of dopant element are preferably ions of one or more elements selected from the group consisting of Co, Mn, Cd, Fe, Ni, Al, and Sn.

In the process for producing a fluorescent powder of the present invention, a preferable example of the hydrothermal reaction step includes a reaction under conditions of 200° C. to 250° C. for 1 to 30 hours. Further, in addition to the above one-stage hydrothermal reaction step, another preferable example includes a two-stage hydrothermal reaction step wherein a reaction at 200° C. to 250° C. for 1 to 30 hours and a subsequent reaction at 400° C. to 600° C. for 30 minutes to 10 hours are carried out.

In a third aspect, the present invention relates to the use of the fluorescent powder. Examples thereof include a light emitting element such as an LED having a light emitting layer comprising the fluorescent powder and a display device comprising the light emitting element. In addition, the examples include a fluorescent lamp comprising a translucent glass tube loaded with a charged gas containing mercury, a fluorescence film provided on the inner wall of the translucent glass tube, and a means of maintaining positive column discharge in the charged gas, in which the fluorescence film comprises the fluorescent powder.

The fluorescent powder of the present invention is an acicular or fibrous fluorescent powder having an aspect ratio of 5 or higher. Therefore, high density orientation can be achieved and thus the fluorescent powder is most suitable as a fluorescent substance for light emitting devices, display devices, fluorescent lamps, and the like. In addition, in the process for producing a fluorescent powder of the present invention, a fluorescent powder of an acicular or fibrous zinc oxide (ZnO) single crystal having an aspect ratio of 5 or higher can be directly produced without a pulverization step or a similar step.

BEST MODE FOR CARRYING OUT THE INVENTION

Figure 1:
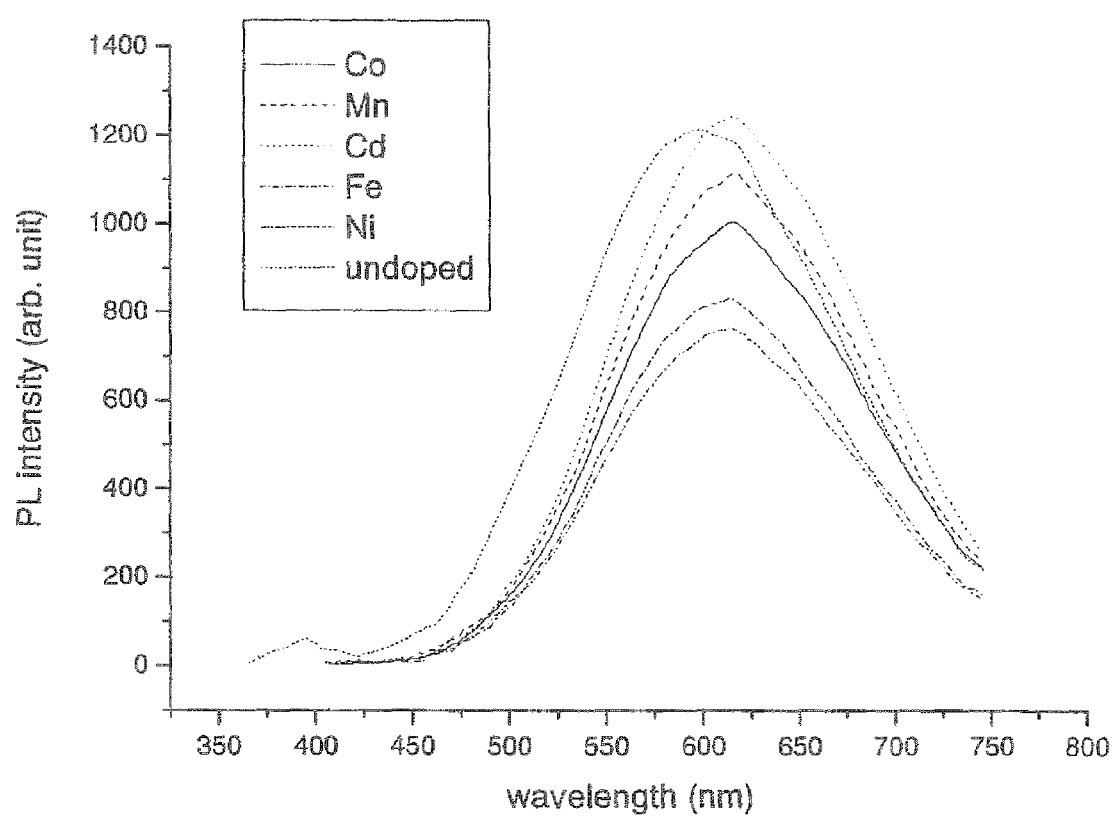
FIG. 1 shows fluorescence wavelength spectrum of fluorescent powders wherein Co, Mn, Cd, Fe, and Ni are used as ions of dopant element and a spectrum of an undoped fluorescent powder.

The Examples and the Comparative Examples of the present invention are described below.

1: Reagents

A commercially available special grade $ZnCl_2$ reagent was used. In addition, $CoSO_4 \cdot 7H_2O$, $MnSO_4 \cdot 5H_2O$, $Cd(NO_3)_2 \cdot 4H_2O$, $FeCl_3 \cdot 6H_2O$, $NiSO_4 \cdot 6H_2O$, $SnCl_2$, and $Al(NO_3) \cdot 9H_2O$ were used as dopant reagents.

2: Preparation of Raw Material Solutions

Solution A:

(1) 8 M NaOH aqueous solution (50 ml) was added to 0.01 M aqueous solution (50 ml) of any one of the above dopant reagents.

(2) A precipitate is formed during the operation in (1) above. 0.3 M $ZnCl_2$ aqueous solution (100 ml) was added to the obtained solution containing the precipitate.

(3) A transparent solution obtained by filtration to remove the precipitate was designated as solution A.

Solution B:

A transparent solution obtained by mixing 4 M NaOH aqueous solution (100 ml) with 0.3 M $ZnCl_2$ aqueous solution (100 ml) was designated as solution B.

Herein, the concentration unit "M" corresponds to "mol/1000 ml (solution)." The solution A was an alkaline solution. Zn was completely dissolved in the alkaline solution, and the alkaline solution was saturated with dopant metal ions. However, the concentration thereof varied depending on the metal type. Solution A and solution B had identical NaOH concentrations and identical $ZnCl_2$ concentrations. However, solution A contained metal ions used as dopants.

3: Hydrothermal Treatment Process (1) Process for Mixing Solution A with Solution B (Half Saturated)

Solution A and Solution B (each 30 ml) were introduced into a Teflon (trade name)-lined container (interior volume: 80 ml). The container was loaded into a stainless-steel autoclave. The autoclave was placed in an air oven and heated at 220° C. at a saturated vapor pressure (23.7 MPa) for 10 hours. The heating-up period was approximately 1 hour. After the treatment, the oven was turned off and the autoclave was naturally cooled in the oven.

(2) Process Using Solution A (Saturated)

The hydrothermal treatment was carried out similarly to the above process with use of Solution A (60 ml).

(3) (Over Saturated)

When solution A was prepared, filtration was carried out to remove a precipitate. However, in this case, hydrothermal treatment was carried out in the manner described above without filtration such that a precipitate remained therein.

4: Fluorescence Evaluation

Table 1 shows starting solutions, synthesis conditions for hydrothermal reaction, and the like for fluorescent powders wherein Co, Mn, Cd, Fe or Ni is used as ions of dopant element in Examples 1 to 20 and undoped fluorescent powders in Examples 21 to 24. In addition, for reference, table 1 lists commercially available fluorescent powders in Comparative Examples 1 to 3. A hydrothermal reaction including two-stage heating was carried out in Examples 1, 3, 5, 7, 9, 11, 13, 15, 17, and 19. A hydrothermal reaction including two-stage heating was carried out in Examples 2, 4, 6, 8, 10, 12, 14, 16, 18, and 20.

TABLE 1

| Sample No. | Dopant transition metal ion | Starting solution | Metal ion concentration ($10^{-2}$ wt %) obtained by the atomic absorption method | Synthesis condition |
|---|---|---|---|---|
| Example 1 | Co | A + B Half-saturated | 0.87 | 220° C. × 10 Hr |
| Example 2 | Co | A + B Half-saturated | 0.87 | 220° C. × 10 Hr ⇒ 500° C. × 5 Hr |
| Example 3 | Co | A saturated | 1.53 | 220° C. × 10 Hr |
| Example 4 | Co | A saturated | 1.53 | 220° C. × 10 Hr ⇒ 500° C. × 5 Hr |
| Example 5 | Mn | A + B Half-saturated | | 220° C. × 10 Hr |
| Example 6 | Mn | A + B Half-saturated | | 220° C. × 10 Hr ⇒ 500° C. × 5 Hr |
| Example 7 | Mn | A saturated | | 220° C. × 10 Hr |
| Example 8 | Mn | A saturated | | 220° C. × 10 Hr ⇒ 500° C. × 5 Hr |
| Example 9 | Cd | A + B Half-saturated | 0.48 | 220° C. × 10 Hr |
| Example 10 | Cd | A + B Half-saturated | 0.48 | 220° C. × 10 Hr ⇒ 500° C. × 5 Hr |
| Example 11 | Cd | A saturated | 0.83 | 220° C. × 10 Hr |
| Example 12 | Cd | A saturated | 0.83 | 220° C. × 10 Hr ⇒ 500° C. × 5 Hr |
| Example 13 | Fe | A + B Half-saturated | 2.73 | 220° C. × 10 Hr |
| Example 14 | Fe | A + B Half-saturated | 2.73 | 220° C. × 10 Hr ⇒ 500° C. × 5 Hr |
| Example 15 | Fe | A saturated | 4.87 | 220° C. × 10 Hr |
| Example 16 | Fe | A saturated | 4.87 | 220° C. × 10 Hr ⇒ 500° C. × 5 Hr |
| Example 17 | Ni | A + B Half-saturated | | 220° C. × 10 Hr |
| Example 18 | Ni | A + B Half-saturated | | 220° C. × 10 Hr ⇒ 500° C. × 5 Hr |
| Example 19 | Ni | A saturated | | 220° C. × 10 Hr |
| Example 20 | Ni | A saturated | | 220° C. × 10 Hr ⇒ 500° C. × 5 Hr |
| Example 21 | Undoped | B | | 220° C. × 10 Hr |
| Example 22 | Undoped | B | | 220° C. × 10 Hr ⇒ 500° C. × 5 Hr |
| Example 23 | Undoped | $ZnCl_2$ aqueous solution (Ph = 7) | Plate shape | 220° C. × 10 Hr |
| Example 24 | Undoped | $ZnCl_2$ aqueous solution (Ph = 7) | Plate shape | 220° C. × 10 Hr ⇒ 500° C. × 5 Hr |
| Comparative Example 1 | Commercially available product (wet-process product) | Sakai Chemical Industry Co., Ltd. | | Unknown |
| Comparative Example 2 | Commercially available product (calcination product) | Sakai Chemical Industry Co., Ltd. | | Unknown |
| Comparative Example 3 | Fine × 50 (fine product) | Sakai Chemical Industry Co., Ltd. | | Unknown |

Further, table 2 shows fluorescence properties (peak wavelengths and peak intensities) and forms of single crystal (maximum crystal sizes and aspect ratios) of the individual fluorescent powders listed in table 1. In addition, a process for evaluating photoluminescence (PL) properties is as follows.
(1.) A sample powder is dispersed on a glass plate by dropwise addition of ethanol
(2) Spectrometer: SPEX1702
(3) Grating: 1200 grooves/mm (blaze wavelength: 500 nm) Process for Spectral Detection of Fluorescence with Diffraction Gratings
(4) Excitation light source: He—Cd laser 325 nm @ 5 mW
(5) Detector: photomultiplier: photoelectron amplifying tube R1387
(6) Measurement temperature: room temperature
(7) Measurement wavelength: 400 to 750 nm
(8) Intensity value may vary within ± several tens of percentage (%) since measurement is carried out with use of samples in powder form

TABLE 2

| | PL properties | | Form of single crystal | |
|---|---|---|---|---|
| Sample No. | Peak wavelength (nm) | Peak intensity | Maximum crystal size (μm) | Aspect ratio |
| Example 1 | 591 | 950 | 22 × 1.2 | 18.3 |
| Example 2 | 614 + 500 | 1238 + 600 | 15 × 0.4 | 37.5 |
| Example 3 | 588 | 387 | | |
| Example 4 | 613 | 1542 | | |
| Example 5 | 591 | 1000 | 19 × 1.9 | 10 |
| Example 6 | 612 | 2519 | 16.4 × 2.3 | 7.1 |
| Example 7 | 611 | 359 | | |
| Example 8 | 615 | 2248 | | |
| Example 9 | 601 | 950 | 19.2 × 1.9 | 10.1 |
| Example 10 | 612 + 500 | 2088 + 1300 | 23.1 × 2.7 | 8.6 |
| Example 11 | 601 | 770 | | |
| Example 12 | 615 | 2274 | | |
| Example 13 | 594 | 1300 | 21.2 × 1.9 | 8.6 |
| Example 14 | 611 + 500 | 1749 + 900 | 17.3 × 2.3 | 7.5 |
| Example 15 | 603 | 1004 | | |
| Example 16 | 614 | 1567 | | |
| Example 17 | 590 | 828 | 18.5 × 1.5 | 12.3 |
| Example 18 | 613 | 2807 | 15.4 × 1.9 | 8.1 |
| Example 19 | 602 | 374 | | |
| Example 20 | 613 | 3548 | | |
| Example 21 | 593 | 1255 | 76.9 × 5.8 | 13.3 |
| Example 22 | 612 | 3057 | | |
| Example 23 | 6309 (broad) | 25 | | |
| Example 24 | 604 + 430 | 118 + 60 | | |
| Comparative Example 1 | 560 | 85 | | |
| Comparative Example 2 | 508 | 4075 | 6.7 × 2.0 | 3.4 |
| Comparative Example 3 | 577 | 34 | | |

The results listed in table 2 show that the fluorescent powders in the Examples of the present invention demonstrated strong fluorescence at their respective peak wavelengths and had aspect ratios of 5.0 or higher, while on the other hand, the fluorescent powders in the Comparative Examples demonstrated weak fluorescence at their respective peak wavelengths or had aspect ratios of 5.0 or lower. In particular, it is shown that each of the fluorescent powders in Examples 2, 10, 14, and 24 had two peak wavelengths.

FIG. 1 shows fluorescence wavelength spectra of fluorescent powders wherein Co, Mn, Cd, Fe or Ni is used as ions of dopant element and a spectrum of an undoped fluorescent powder.

Table 3 shows starting solutions and synthesis conditions of hydrothermal reaction for other fluorescent powders wherein Co, Mn, Cd, Fe or Ni is used as ions of dopant element in Examples 25 to 39 and undoped fluorescent powders in Examples 40 to 42.

TABLE 3

| Sample no. | Dopant transition metal ion | Starting solution | Synthesis condition |
| --- | --- | --- | --- |
| Example 25 | Mn | A saturated Mn | 220° C. × 10 Hr ⇒ 500° C. × 5 Hr |
| Example 26 | Mn | A + B Half-saturated Mn | 220° C. × 10 Hr ⇒ 500° C. × 5 Hr |
| Example 27 | Mn | Over saturated | 220° C. × 10 Hr ⇒ 500° C. × 5 Hr |
| Example 28 | Ni | A saturated Ni | 220° C. × 10 Hr ⇒ 500° C. × 5 Hr |
| Example 29 | Ni | A + B Half-saturated Ni | 220° C. × 10 Hr ⇒ 500° C. × 5 Hr |
| Example 30 | Ni | Over saturated | 220° C. × 10 Hr ⇒ 500° C. × 5 Hr |
| Example 31 | Co | A saturated Co | 220° C. × 10 Hr ⇒ 500° C. × 5 Hr |
| Example 32 | Co | A + B Half-saturated Co | 220° C. × 10 Hr ⇒ 500° C. × 5 Hr |
| Example 33 | Co | Over saturated | 220° C. × 10 Hr ⇒ 500° C. × 5 Hr |
| Example 34 | Cd | A saturated Cd | 220° C. × 10 Hr ⇒ 500° C. × 5 Hr |
| Example 35 | Cd | A + B Half-saturated Cd | 220° C. × 10 Hr ⇒ 500° C. × 5 Hr |
| Example 36 | Cd | Over saturated | 220° C. × 10 Hr ⇒ 500° C. × 5 Hr |
| Example 37 | Fe | A saturated Fe | 220° C. × 10 Hr ⇒ 500° C. × 5 Hr |
| Example 38 | Fe | A + B Half-saturated Fe | 220° C. × 10 Hr ⇒ 500° C. × 5 Hr |
| Example 39 | Fe | Over saturated | 220° C. × 10 Hr ⇒ 500° C. × 5 Hr |
| Example 40 | Undoped | B | 220° C. × 10 Hr ⇒ 500° C. × 5 Hr |
| Example 41 | Undoped | B | 220° C. × 10 Hr |
| Example 42 | Undoped | B | 220° C. × 10 Hr ⇒ 500° C. × 5 Hr |

Further, table 4 shows fluorescence properties (peak wavelengths and peak intensities) and forms of single crystal (maximum crystal sizes and aspect ratios) of the individual fluorescent powders listed in table 3,

TABLE 4

| | PL properties | | Form of single crystal | |
| --- | --- | --- | --- | --- |
| Sample no. | Peak wavelength (nm) | Peak intensity | Maximum crystal size (μm) | Aspect ratio |
| Example 25 | 613 | 2709 | 33.5 × 3.8 | 8.8 |
| Example 26 | 613 | 3024 | 43.9 × 7.7 | 5.7 |
| Example 27 | 615 | 1409 | 30.3 × 3.2 | 9.5 |
| Example 28 | 612 | 2692 | 21.9 × 3.8 | 5.8 |
| Example 29 | 613 | 2956 | 32.3 × 2.9 | 11.1 |
| Example 30 | 613 | 2038 | 37.4 × 3.8 | 9.8 |
| Example 31 | 613 | 1023 | 19.4 × 1.6 | 12.1 |
| Example 32 | 615 | 1713 | 45.2 × 5.2 | 8.7 |
| Example 33 | 620 | 412 | 18.7 × 2.3 | 8.1 |
| Example 34 | 436/611 | 3132/3016 | 73.5 × 3.9 | 18.8 |
| Example 35 | 614 | 3206 | 20.6 × 2.6 | 7.9 |
| Example 36 | 614 | 2029 | 15.5 × 2.3 | 6.7 |
| Example 37 | 612 | 1765 | 29.0 × 3.9 | 7.4 |
| Example 38 | 609 | 1767 | 23.2 × 2.6 | 8.9 |
| Example 39 | 615 | 772 | 45.2 × 5.2 | 8.7 |
| Example 40 | 613 | 3338 | 16.8 × 1.9 | 8.8 |
| Example 41 | 596 | 1212 | 29.7 × 1.9 | 15.6 |
| Example 42 | 615 | 3136 | 49.0 × 5.2 | 9.4 |

The results listed in table 4 show that the fluorescent powders in the Examples of the present invention demonstrated strong fluorescence at their respective peak wavelengths and had aspect ratios of 5.0 or higher. In particular, it is shown that the fluorescent powder in Example 34 had two peak wavelengths.

Table 5 shows starting solutions and synthesis conditions of hydrothermal reaction for other fluorescent powders wherein Al, Sn, Mn, Co, Cd or Fe is used as ions of dopant element in Examples 43 to 53 and undoped fluorescent powders in Examples 54 and 55.

TABLE 5

| Sample no. | Dopant transition metal ion | Starting solution | Synthesis condition |
|---|---|---|---|
| Example 43 | Al | Saturated A | 220° C. × 10 Hr |
| Example 44 | Al | Saturated A | 220° C. × 10 Hr ⇒ 500° C. × 5 Hr |
| Example 45 | Al | Over saturated A | 220° C. × 10 Hr ⇒ 500° C. × 5 Hr |
| Example 46 | Sn | Saturated A | 220° C. × 10 Hr |
| Example 47 | Sn | Saturated A | 220° C. × 10 Hr ⇒ 500° C. × 5 Hr |
| Example 48 | Sn | Over saturated | 220° C. × 10 Hr ⇒ 500° C. × 5 Hr |
| Example 49 | Mn | Over saturated | 220° C. × 10 Hr ⇒ 500° C. × 5 Hr |
| Example 50 | Ni | Over saturated | 220° C. × 10 Hr ⇒ 500° C. × 5 Hr |
| Example 51 | Co | Over saturated | 220° C. × 10 Hr ⇒ 500° C. × 5 Hr |
| Example 52 | Cd | Over saturated | 220° C. × 10 Hr ⇒ 500° C. × 5 Hr |
| Example 53 | Fe | Over saturated | 220° C. × 10 Hr ⇒ 500° C. × 5 Hr |
| Example 54 | No | Undoped B | 220° C. × 10 Hr |
| Example 55 | No | Undoped B | 220° C. × 10 Hr ⇒ 500° C. × 5 Hr |

Further, table 6 shows fluorescence properties (peak wavelengths and peak intensities) and forms of single crystal (maximum crystal size and aspect ratios) of the individual fluorescent powders listed in table 5.

TABLE 6

| | PL properties | | Form of single crystal | |
|---|---|---|---|---|
| Sample No. | Peak wavelength (nm) | Peak intensity | Maximum crystal size (μm) | Aspect ratio |
| Example 43 | 392/608 | 33/632 | 50.0 × 5.0 | 10.0 |
| Example 44 | 612 | 1893 | 35.0 × 5.2 | 6.7 |
| Example 45 | 610 | 1678 | 51.7 × 5.0 | 10.3 |
| Example 46 | 390/592 | 172/270 | 36.7 × 4.2 | 8.7 |
| Example 47 | 615 | 2430 | 63.3 × 3.3 | 19.2 |
| Example 48 | 617 | 1834 | 28.3 × 2.5 | 11.3 |
| Example 49 | 615 | 819 | 56.7 × 5.3 | 10.7 |
| Example 50 | 612 | 2038 | 95.0 × 5.8 | 16.4 |
| Example 51 | 612 | 647 | 55.0 × 2.7 | 20.4 |
| Example 52 | 616 | 2497 | 26.7 × 2.5 | 10.7 |
| Example 53 | 617 | 925 | 41.7 × 3.3 | 12.6 |
| Example 54 | 382/563 | 26/148 | | |
| Example 55 | 382/572 | 65/263 | | |

The results listed in table 6 show that the fluorescent powders in the Examples of the present invention demonstrated strong fluorescence at their respective peak wavelengths and had aspect ratios of 5.0 or higher. In particular, it is shown that each of the fluorescent powders in Examples 43, 46, 54, and 55 had two peak wavelengths.

Figure 2:
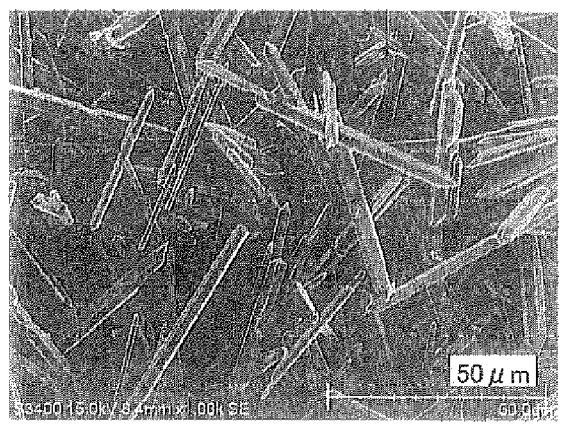
FIGS. 2A to 2C show SEM images of the fluorescent powder in Example 43.
Figure 2:
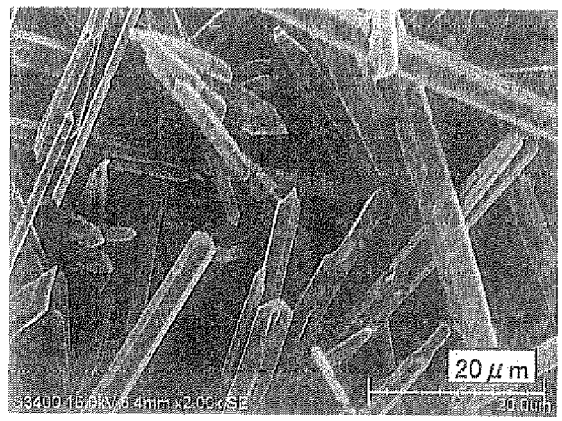
Figure 2:
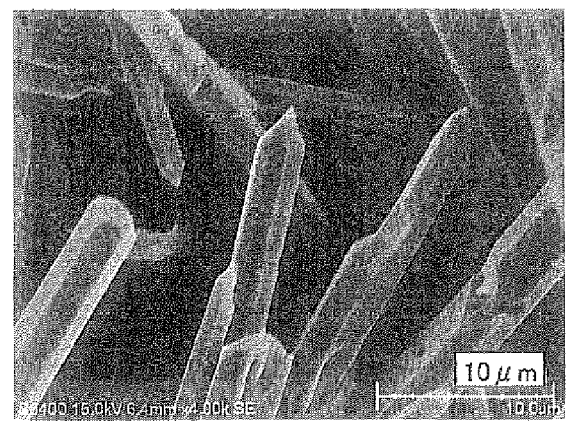

FIGS. 2A to 2C show SEM images of the fluorescent powder in Example 43. As is apparent from FIGS. 2A to 2C, it is shown that the fluorescent powder of the present invention is an acicular or fibrous zinc oxide single crystal.

A zinc oxide crystal can also be formed into a columnar crystal by chemical vapor deposition (CVD). However, in this process, columnar crystals are merely arranged in a film and a dispersed powder crystal cannot be obtained. The columnar crystal growth is observed in the C-axis direction. Therefore, it is considered that the reason for columnar crystal growth is attributed to the crystal structure. On the other hand, the reason for high aspect ratios obtained by the hydrothermal synthesis method is considered that, under hydrothermal conditions, the growth rate is higher than that in the case of vapor growth, which results in obvious growth in the C-axis direction. Even under hydrothermal conditions, it is possible to induce growth of a large bulk (non-acicular) crystal by reducing the growth rate.

An acicular or fibrous zinc oxide single crystal obtained by hydrothermal synthesis can be monodispersed and has columnar form. Therefore, it is considered that such crystal is advantageous for use as a fluorescent material for a variety of systems. For instance, since a columnar single crystal is oriented in a specific crystal plane, the light emission efficiency (included among the fluorescent substance properties) of such crystal becomes higher than that of a zinc oxide crystal having a usual form. The acicular or fibrous zinc oxide single crystal of the present invention is characterized in that it can be formed into a high-density powder compact, that it can be easily molded, and that it is unlikely to aggregate, for example. Thus, the use of such crystal is effective for downsizing or thinning a system.

Hereinafter, an explanation is made for a fluorescent powder composed of a zinc oxide single crystal that has photoluminescence (PL) properties characterized by two peaks. A fluorescent material is a basic material that is essential for white LEDs, plasma display panels (PDPs), next-generation lighting systems, inorganic EL displays, light accumulation materials, light emission displays, and the like. Commercially available zinc oxide fluorescent substances emit purple light. However, the fluorescent powder composed of a zinc oxide single crystal of the present invention emits yellow light. A material having photoluminescence (PL) properties characterized by two peaks has a yellow-to-orange peak and an orange-to-green peak. In short, it is possible to obtain an intermediate color between yellow and green. As described above, the powdery luminescent material composed of an acicular or fibrous zinc oxide single crystal of the present invention is advantageous in that the luminescent color thereof can be controlled and can be selected from a wide range of colors.

INDUSTRIAL APPLICABILITY

The fluorescent powder of the present invention is an acicular or fibrous fluorescent powder having an aspect ratio of 5 or higher. Therefore, high density orientation can be achieved and thus the fluorescent powder is most suitable for light emitting devices, display devices, fluorescent lamps, and the like. In particular, it is expected to be used as an LED fluorescent substance or a fluorescent substance used for next-generation lighting systems.

The invention claimed is:
1. A process for producing a fluorescent powder comprising an acicular or fibrous zinc oxide single crystal with an aspect ratio of 5 or higher, comprising:
   a step of producing a raw material solution selected from the group consisting of a raw material solution (A) that is a solution containing zinc ions and ions of dopant element, a raw material solution (B) that is an alkali solution containing zinc ions, and a mixed solution of the raw material solution (A) and the raw material solution (B); and a hydrothermal reaction step wherein a hydrothermal reaction of the raw material solution is carried out in a hermetically sealed vessel at a subcritical or supercritical pressure, wherein the hydrothermal reaction step is carried out at a temperature from 200° C. to 250° C. for 1 to 30 hours and subsequently carried out at a temperature from 400° C. to 600° C. for 30 minutes to 10 hours.

2. The process for producing a fluorescent powder according to claim 1, wherein the zinc ions are unsaturated, semi-saturated, or saturated in the raw material solution (A), in the raw material solution (B), or in the mixed solution of the raw material solution (A) and the raw material solution (B).

3. The process for producing a fluorescent powder according to claim 1, wherein the ions of dopant element are ions of one or more elements selected from the group consisting of Co, Mn, Cd, Fe, Ni, Al, and Sn.

* * * * *